US012777583B2

(12) United States Patent
Ishida

(10) Patent No.: US 12,777,583 B2
(45) Date of Patent: Oct. 27, 2026

(54) PRINTED WIRING BOARD

(71) Applicant: IBIDEN CO., LTD., Ogaki (JP)

(72) Inventor: Atsushi Ishida, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 191 days.

(21) Appl. No.: 18/790,375

(22) Filed: Jul. 31, 2024

(65) Prior Publication Data

US 2025/0056718 A1 Feb. 13, 2025

(30) Foreign Application Priority Data

Aug. 7, 2023 (JP) ................................ 2023-128273

(51) Int. Cl.

*H05K 1/02* (2006.01)
*H05K 1/03* (2006.01)
*H05K 1/11* (2006.01)
*H05K 3/18* (2006.01)

(52) U.S. Cl.

CPC ......... *H05K 1/0298* (2013.01); *H05K 1/0373* (2013.01); *H05K 1/115* (2013.01); *H05K 3/188* (2013.01); *H05K 2201/096* (2013.01); *H05K 2201/09827* (2013.01)

(58) Field of Classification Search

CPC .................................................... H05K 1/0298
USPC .......................................................... 174/255
See application file for complete search history.

(56) References Cited

U.S. PATENT DOCUMENTS

2009/0314526 A1* 12/2009 Nagasawa ............. H05K 3/381 174/262
2015/0136459 A1* 5/2015 Kunieda ............. H05K 3/4682 174/257
2022/0071016 A1* 3/2022 Hwang .................. H05K 3/427
2024/0147617 A1* 5/2024 Nirengi .................... H05K 1/09

FOREIGN PATENT DOCUMENTS

JP 2015-126103 A 7/2015

* cited by examiner

*Primary Examiner* — Stanley Tso
(74) *Attorney, Agent, or Firm* — Finnegan, Henderson, Farabow, Garrett & Dunner, LLP

(57) ABSTRACT

A printed wiring board includes a first conductor layer, a resin insulating layer laminated on the first conductor layer, a second conductor layer formed on a surface of the resin insulating layer, and a via conductor formed in the resin insulating layer such that the via conductor is connecting the first conductor layer and the second conductor layer. The resin insulating layer includes resin and inorganic particles including first particles and second particles such that the first particles have flat exposed portions, the second particles are embedded in the resin, and the surface of the resin insulating layer includes the resin and the flat exposed portions of the first particles.

20 Claims, 9 Drawing Sheets

PRINTED WIRING BOARD

CROSS-REFERENCE TO RELATED APPLICATIONS

The present application is based upon and claims the benefit of priority to Japanese Patent Application No. 2023-128273, filed Aug. 7, 2023, the entire contents of which are incorporated herein by reference.

BACKGROUND OF THE INVENTION

Field of the Invention

The present invention relates to a printed wiring board.

Description of Background Art

Japanese Patent Application Laid-Open Publication No. 2015-126103 describes a printed wiring board having a first conductor layer, an insulating layer formed on the first conductor layer, and a second conductor layer formed on the insulating layer. The entire contents of this publication are incorporated herein by reference.

SUMMARY OF THE INVENTION

According to one aspect of the present invention, a printed wiring board includes a first conductor layer, a resin insulating layer laminated on the first conductor layer, a second conductor layer formed on a surface of the resin insulating layer, and a via conductor formed in the resin insulating layer such that the via conductor is connecting the first conductor layer and the second conductor layer. The resin insulating layer includes resin and inorganic particles including first particles and second particles such that the first particles have flat exposed portions, the second particles are embedded in the resin, and the surface of the resin insulating layer includes the resin and the flat exposed portions of the first particles.

According to another aspect of the present invention, a method of manufacturing a printed wiring board includes forming a resin insulating layer on a first conductor layer, forming a second conductor layer on a surface of the resin insulating layer, and forming a via conductor in the resin insulating layer such that the via conductor connects the first conductor layer and the second conductor layer. The resin insulating layer includes resin and inorganic particles including first particles and second particles such that the first particles have flat exposed portions, the second particles are embedded in the resin, and the surface of the resin insulating layer includes the resin and the flat exposed portions of the first particles.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
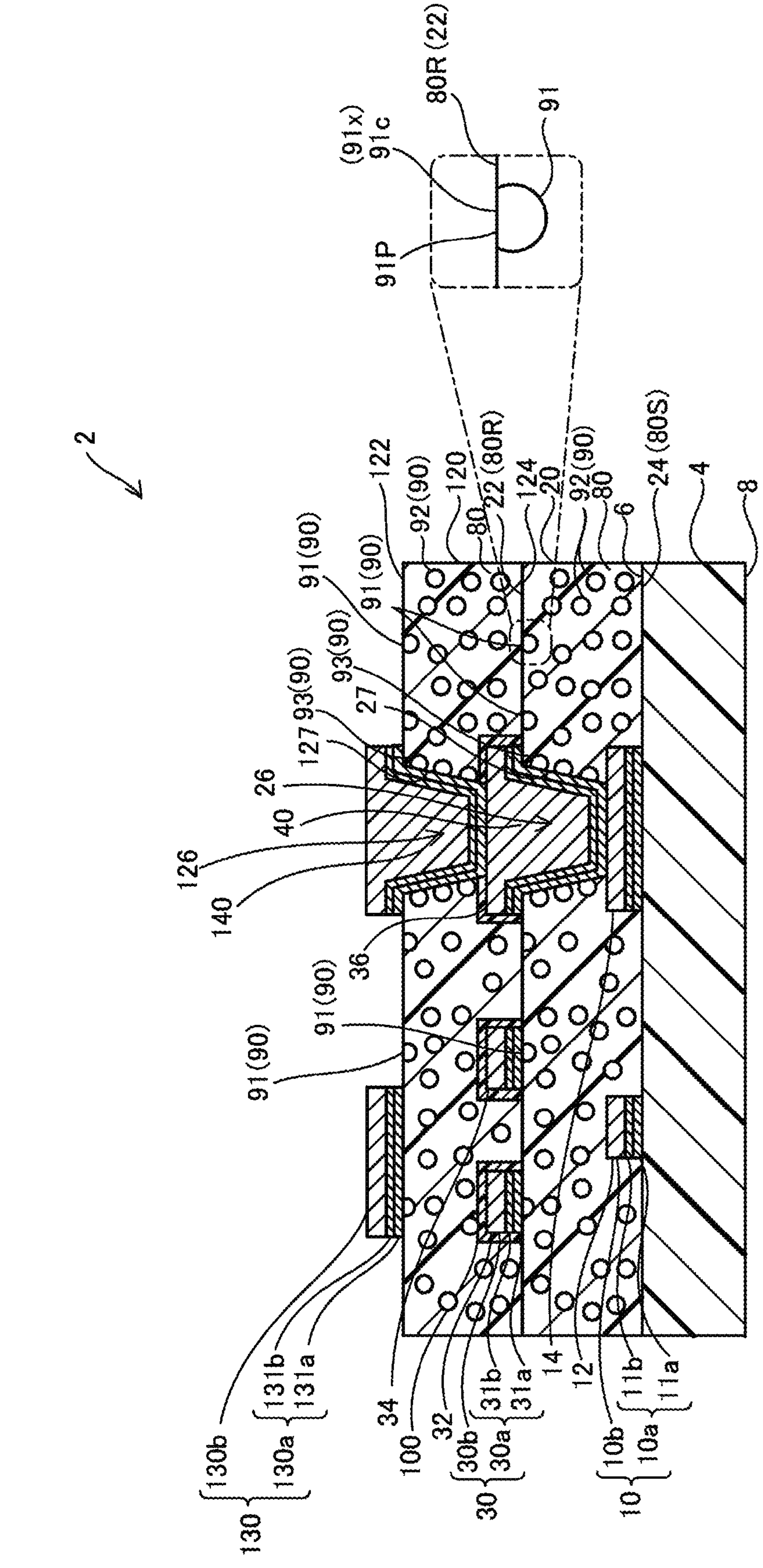
FIG. 1 is a cross-sectional view schematically illustrating a printed wiring board according to an embodiment of the present invention.

Embodiments will now be described with reference to the accompanying drawings, wherein like reference numerals designate corresponding or identical elements throughout the various drawings.

Embodiment

Figure 2:
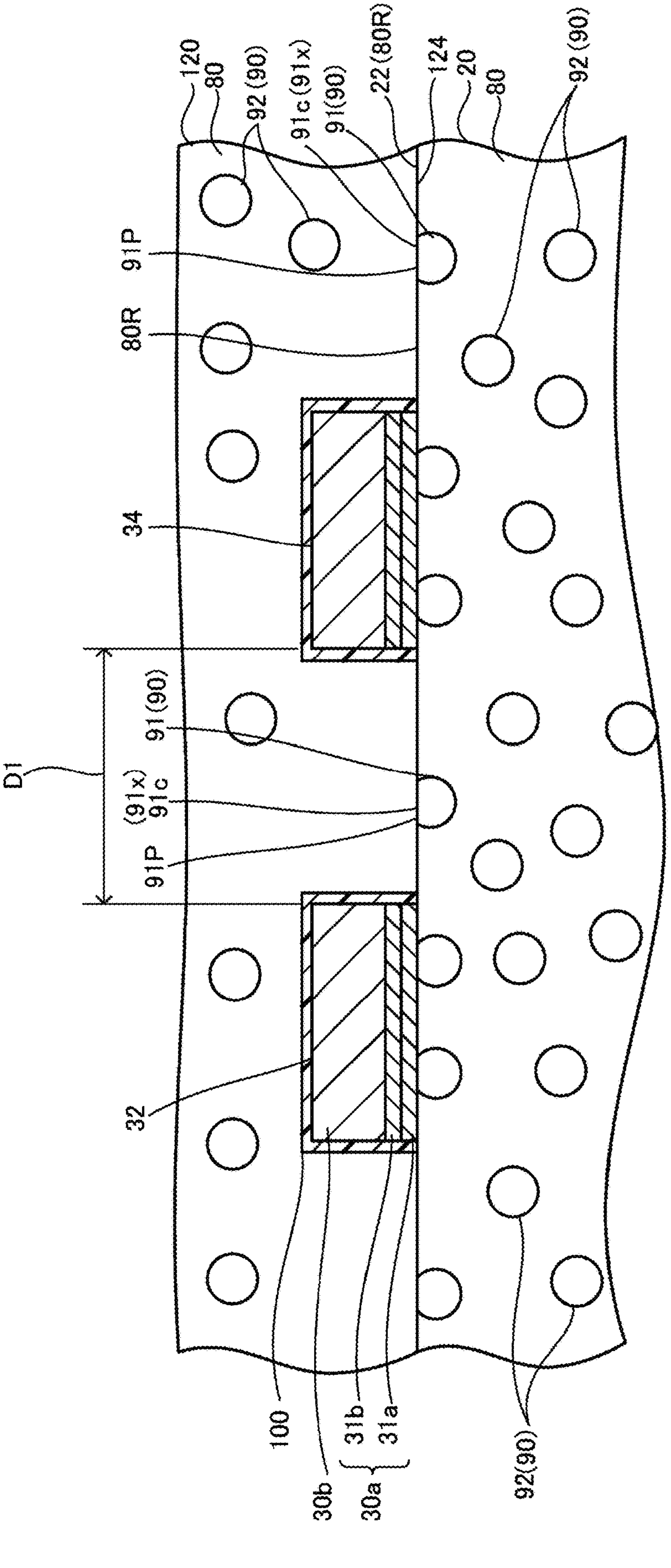
FIG. 2 is an enlarged cross-sectional view schematically illustrating a portion of a printed wiring board according to an embodiment of the present invention.
Figure 3:
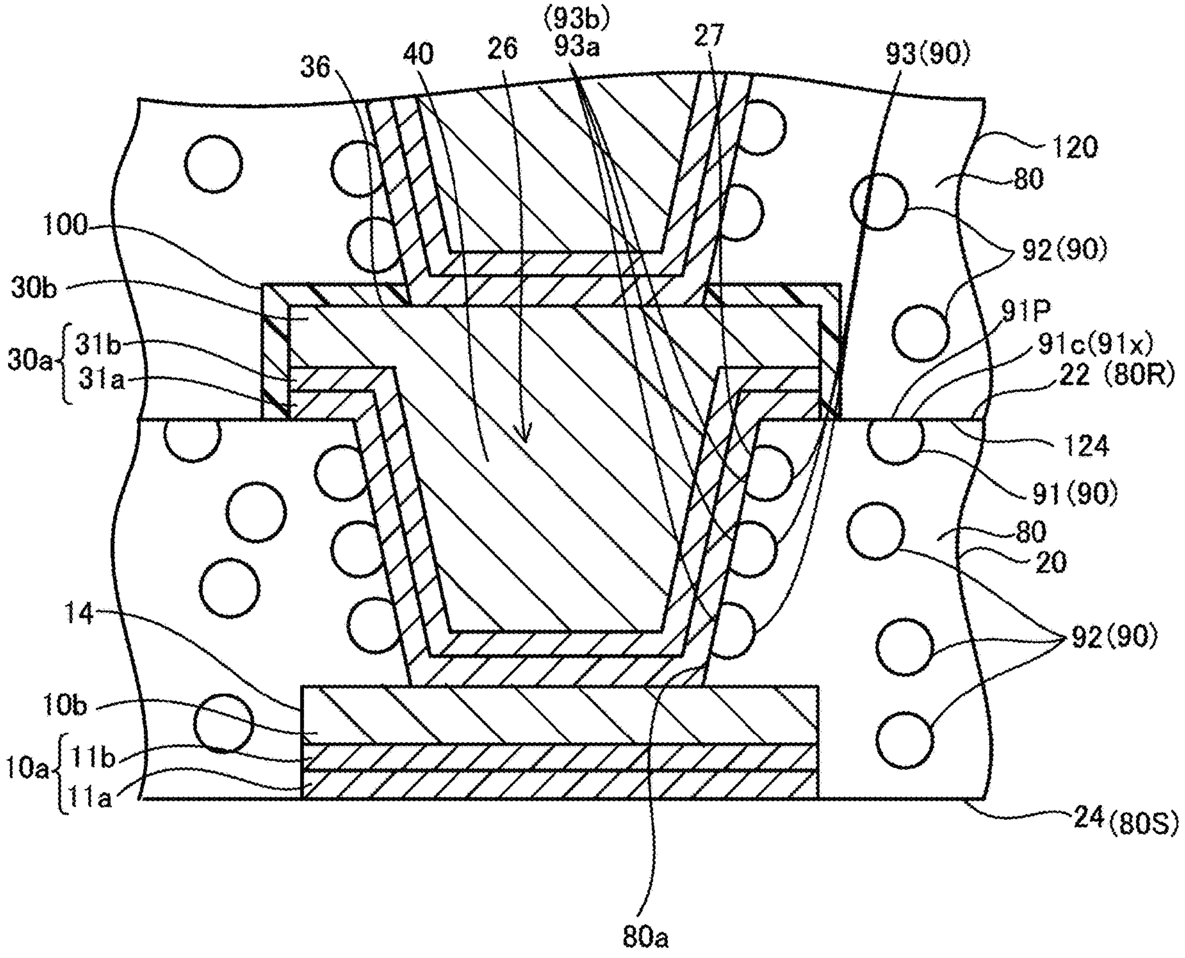
FIG. 3 is an enlarged cross-sectional view schematically illustrating a part of a printed wiring board according to an embodiment of the present invention.

FIG. 1 is a cross-sectional view illustrating a printed wiring board 2 of an embodiment. FIGS. 2 and 3 are each an enlarged cross-sectional view illustrating a part of the printed wiring board 2 of the embodiment. As illustrated in FIG. 1, the printed wiring board 2 has an insulating layer 4, a conductor layer (first conductor layer) 10, a resin insulating layer (first resin insulating layer) 20, a conductor layer (second conductor layer) 30, a via conductor 40, a resin insulating layer (second resin insulating layer) 120, a conductor layer (third conductor layer) 130, and a via conductor 140.

The insulating layer 4 is formed using a resin. The insulating layer 4 may contain inorganic particles such as silica particles. The insulating layer 4 may contain a reinforcing material such as a glass cloth. The insulating layer 4 has a third surface 6 and a fourth surface 8 on an opposite side with respect to the third surface 6.

The first conductor layer 10 is formed on the third surface 6 of the insulating layer 4. The first conductor layer 10 includes a signal wiring 12 and a pad 14. Although not illustrated in the drawings, the first conductor layer 10 also includes conductor circuits other than the signal wiring 12 and the pad 14. The first conductor layer 10 is mainly formed of copper. The first conductor layer 10 is formed of a seed layer (10*a*) on the insulating layer 4 and an electrolytic plating layer (10*b*) on the seed layer (10*a*). The seed layer (10*a*) has a thickness of less than 0.5 μm. The seed layer (10*a*) is formed of a first layer (11*a*) on the third surface 6 and a second layer (11*b*) on the first layer (11*a*). The first layer (11*a*) is in contact with the insulating layer 4. A ratio of a thickness of the first layer (11*a*) to a thickness of the second layer (11*b*) ((the thickness of the first layer)/(the thickness of the second layer)) is 0.25 or more and 0.7 or less. The second layer (11*b*) is preferably thicker than the first layer (11*a*).

The first layer (11*a*) is formed of an alloy (copper alloy) containing copper and a metal other than copper. For example, the first layer (11*a*) is formed of an alloy containing copper and aluminum. The first layer (11*a*) is formed of an alloy containing copper, aluminum, and a specific metal. Examples of the specific metal include nickel, zinc, gallium, silicon, and magnesium. The alloy preferably contains one type of specific metal, or two types of specific metals, or three types of specific metals. An example of the specific metal is silicon. A content of aluminum in the alloy is 1.0 at % or more and 15.0 at % or less. When the alloy contains a specific metal, a content of the specific metal in the alloy is 0.5 at % or more and 10.0 at % or less. The first layer (11*a*) may contain impurities. Examples of the impurities include oxygen and carbon. The first layer (11*a*) can contain oxygen or carbon. The first layer (11*a*) can contain oxygen and carbon. In the embodiment, the alloy further contains carbon. A content of carbon in the alloy is 50 ppm or less. The alloy further contains oxygen. A content of oxygen in the alloy is 100 ppm or less. The values of the contents of the elements described above are examples. Among the elements forming the first layer (11*a*), copper has the largest content. The content of aluminum is the next largest. When the alloy contains a specific metal, the content of the specific metal is less than the content of aluminum. Therefore, copper is a primary metal, aluminum is a first secondary metal, and the specific metal is a second secondary metal. A content of the impurities is smaller than the content of the specific metal.

The second layer (11*b*) is formed of copper. The electrolytic plating layer (10*b*) is formed of copper.

The content of copper in the copper alloy forming the first layer (11*a*) is greater than 90 at %. The content of copper in the alloy is less than 99 at %. The content of copper in the copper alloy is 98 at % or less. A content of copper forming the second layer (11*b*) is 99.9 at % or more. The content of copper in the second layer (11*b*) is preferably 99.95 at % or more. The electrolytic plating layer (10*b*) is formed of copper. A content of copper forming the electrolytic plating layer (10*b*) is 99.9 at % or more. The content of copper in the electrolytic plating layer (10*b*) is preferably 99.95 at % or more.

The resin insulating layer (first resin insulating layer) 20 is formed on the third surface 6 of the insulating layer 4 and on the first conductor layer 10. The first resin insulating layer 20 has a first surface 22 and a second surface 24 on an opposite side with respect to the first surface 22. The second surface 24 of the first resin insulating layer 20 faces the first conductor layer 10. The first resin insulating layer 20 has an opening (via conductor opening) 26 that exposes the pad 14. The opening 26 has a bottom diameter of 20 μm or more and 50 μm or less. The resin insulating layer (first resin insulating layer) 20 is formed of a resin 80 and a large number of inorganic particles 90 dispersed in the resin 80. The resin 80 has an upper surface (80R) and a lower surface (80S) on an opposite side with respect to the upper surface (80R). The upper surface (80R) forms the first surface 22, and the lower surface (80S) forms the second surface 24. The resin 80 is an epoxy resin. Examples of the resin include a thermosetting resin and a photocurable resin. The inorganic particles 90 are, for example, glass particles or alumina particles. The inorganic particles 90 preferably contain oxygen elements. The inorganic particles 90 have an average particle size of 0.5 μm or less. An amount of the inorganic particles 90 in the resin insulating layer 20 is 70 wt % or more.

As illustrated in FIGS. 1 and 2, the inorganic particles 90 include first inorganic particles 91 forming the first surface 22 and second inorganic particles 92 embedded in the resin 80. The second inorganic particles are completely embedded in the resin 80. The second inorganic particles 92 each have a spherical shape. The first inorganic particles 91 are formed from the second inorganic particles 92. The first inorganic particles 91 are each formed by removing a part of a second inorganic particle 92. The first inorganic particles 91 and the second inorganic particles 92 are different in shape. The first inorganic particles 91 each have a substantially spherical segment shape. A part of a surface of each of the first inorganic particles 91 is a substantial flat surface, and the flat surface is substantially flat. The flat surface forms a cut surface (91*c*) of a spherical segment and faces the first surface 22. Or, a part of the surface of each of the first inorganic particles 91 is a substantially curved surface, and the curved surface is substantially smooth. The curved surface forms a cut surface (91*c*) of a spherical segment and faces the first surface 22. The first inorganic particles 91 are embedded in the resin 80 such that the cut surfaces (91*c*) form the first surface 22. The first surface 22 is formed by the cut surfaces (91*c*) of the first inorganic particles 91 and the upper surface (80R) of the resin 80. The cut surfaces (91*c*) and the upper surface (80R) form substantially the same surface. The cut surfaces (91*c*) are exposed from the upper surface (80R) of the resin 80. Of the surface of each of the first inorganic particles 91, a portion exposed by the upper surface (80R) of the resin 80 is an exposed portion (91P). A surface (exposed surface) (91*x*) of the exposed portion (91P) forms the first surface 22. The exposed surface (first exposed surface) (91*x*) is a substantially flat surface or a substantially curved surface. The first exposed surface (91*x*) is substantially flat. The first exposed surface (91*x*) is substantially smooth. The first exposed surface (91*x*) and the cut surface (91*c*) are substantially the same surface. The first exposed surfaces (91*x*) and the upper surface (80R) of the resin 80 form the first surface 22. The first exposed surfaces (91*x*) and the upper surface (80R) form substantially the same surface.

The first surface 22 has an arithmetic mean roughness (Ra) of less than 0.08 μm. The roughness (Ra) of the first surface 22 is preferably 0.05 μm or less. The roughness (Ra) of the first surface 22 is more preferably 0.03 μm or less. The upper surface (80R) has an arithmetic mean roughness (Ra) of less than 0.08 μm. The roughness (Ra) of the upper surface (80R) is preferably 0.05 μm or less. The roughness (Ra) of the upper surface (80R) is more preferably 0.03 μm or less.

The first surface 22 can have steps (first steps) between the first exposed surfaces (91*x*) and the upper surface (80R). The first exposed surfaces (91*x*) protrude relative to the upper surface (80R). Or, the first exposed surfaces (91*x*) are recessed relative to the upper surface (80R). Preferably, the first exposed surfaces (91*x*) protrude relative to the upper surface (80R). Sizes of the steps (first steps) (distances between the first exposed surfaces (91*x*) and the upper surface (80R) of the resin 80) are 5 μm or less. The sizes of the first steps are preferably 3 μm or less. The sizes of the first steps are more preferably 1.5 μm or less. Even when the steps (first steps) are formed, since the steps are small, the first exposed surfaces (91*x*) and the upper surface (80R) of the resin 80 form a substantially common surface. For example, the sizes of the steps are represented by a maximum value.

A ratio (R) of a volume of a first inorganic particle 91 to a volume of a sphere (assumed sphere) predicted from the first inorganic particle 91 ((volume of a first inorganic particle)/(volume of an assumed sphere)) is 0.6 or more and less than 1. The ratio (R) is preferably 0.8 or more. The ratio (R) is more preferably 0.9 or more. The ratio (R) is most preferably 0.95 or more. The ratio (R) is preferably 0.97 or less. A thermal expansion coefficient of the resin 80 near the upper surface (80R) is controlled.

As illustrated in FIGS. 1 and 3, the inorganic particles 90 further include third inorganic particles 93 that form an inner wall surface (first inner wall surface) 27 of the opening (via conductor opening) 26. The third inorganic particles 93 each have a shape obtained by cutting a sphere along a flat surface. The third inorganic particles 93 each have a shape obtained by cutting a second inorganic particle 92 with a plane. The third inorganic particles 93 are formed from the second inorganic particles 92. The third inorganic particles 93 are each formed by removing a part of a second inorganic particle 92. The third inorganic particles 93 each have a substantially spherical segment shape. The first inorganic particles 91 and the third inorganic particles 93 are substantially similar in shape. The third inorganic particles 93 and the second inorganic particles 92 are different in shape. The third inorganic particles 93 each have a flat part (93*a*). The flat parts (93*a*) form the inner wall surface 27. The inner wall surface 27 is formed of the resin 80 and the flat parts (93*a*). The flat parts (93*a*) and a surface (first resin surface) (80*a*) of the resin 80 that forms the inner wall surface 27 form a substantially common surface. No unevenness is formed on the resin 80 that forms the inner wall surface 27. The surface (80*a*) of the resin 80 that forms the inner wall surface 27 is substantially smooth. No unevenness is formed on exposed surfaces (93*b*) of the flat parts (93*a*) (surfaces that form the inner wall surface 27). The exposed surfaces (second exposed surfaces) (93*b*) of the flat parts (93*a*) are smooth. The inner wall surface 27 is formed smooth. The inner wall surface 27 has an arithmetic mean roughness (Ra) of 1.0 μm or less. The surface (80*a*) of the resin 80 that forms the inner wall surface 27 has a roughness (Ra) of 1.0 μm or less.

The inner wall surface 27 can have steps (second steps) between the flat parts (93*a*) and the surface (80*a*) of the resin 80 that forms the inner wall surface 27. The exposed surfaces (second exposed surfaces) (93*b*) of the flat parts (93*a*) protrude relative to the surface (80*a*) of the resin 80 that forms the inner wall surface 27. Or, the exposed surfaces (93*b*) of the flat parts (93*a*) are recessed relative to the surface (80*a*) of the resin 80 that forms the inner wall surface 27. Preferably, the exposed surfaces (93*b*) protrude relative to the surface (80*a*). Sizes of the steps (second steps) (distances between the exposed surfaces (93*b*) of the flat parts (93*a*) and the surface (80*a*) of the resin 80 that forms the inner wall surface 27) are 5 μm or less. The sizes of the second steps are preferably 3 μm or less. The sizes of the second steps are more preferably 1.5 μm or less. Even when the steps (second steps) are formed, since the steps are small, the exposed surfaces (93*b*) of the flat parts (93*a*) and the surface (80*a*) of the resin 80 that forms the inner wall surface 27 form a substantially common surface. When the first exposed surfaces (91*x*) protrude, the second exposed surfaces (93*b*) also protrude. When the first exposed surfaces (91*x*) are recessed, the second exposed surfaces (93*b*) also are recessed.

As illustrated in FIG. 1, the second conductor layer 30 is formed on the first surface 22 of the resin insulating layer (first resin insulating layer) 20. The second conductor layer 30 includes a first signal wiring 32, a second signal wiring 34, and a land 36. Although not illustrated in the drawings, the second conductor layer 30 also includes conductor circuits other than the first signal wiring 32, the second signal wiring 34, and the land 36. The first signal wiring 32 and the second signal wiring 34 form a pair wiring. The first signal wiring 32 and the second signal wiring 34 are adjacent to each other. As illustrated in FIG. 2, a distance (D1) between the first signal wiring 32 and the second signal wiring 34 is 1.5 μm or more and 10 μm or less. The distance (D1) is preferably 1.5 μm or more and 8 μm or less. The first signal wiring 32 is an example of a first conductor circuit, and the second signal wiring 34 is an example of a second conductor circuit.

The conductor layer (second conductor layer) 30 is mainly formed of copper. The second conductor layer 30 is formed of a seed layer (30*a*) on the first surface 22 and an electrolytic plating layer (30*b*) on the seed layer (30*a*). The seed layer (30*a*) is formed of a first layer (31*a*) on the first surface 22 and a second layer (31*b*) on the first layer (31*a*). The seed layer (30*a*) has a thickness of less than 0.5 μm. The first conductor layer 10 and the second conductor layer 30 are similar. A relationship between the thickness of the first layer (31*a*) and the thickness of the second layer (31*b*) is similar to the relationship between the thickness of the first layer (11*a*) and the thickness of the second layer (11*b*). The first layer (31*a*) and the second layer (31*b*) form the second conductor layer 30, and the first layer (11*a*) and the second layer (11*b*) form the first conductor layer 10. The first layer (31*a*) is formed of an alloy (copper alloy) similar to the first layer (11*a*). The second layer (31*b*) is formed of copper. The electrolytic plating layer (30*b*) is formed of copper. The first layer (31*a*) is in contact with the first surface 22.

The via conductor (first via conductor) 40 is formed in the opening (via conductor opening) 26. The opening 26 penetrates the first resin insulating layer 20 and reaches the first conductor layer 10. The via conductor (first via conductor) 40 connects the first conductor layer 10 and the second conductor layer 30. In FIG. 1, the via conductor 40 connects the pad 14 and the land 36. The via conductor 40 is formed of a seed layer (30*a*) and an electrolytic plating layer (30*b*) on the seed layer (30*a*). The seed layer (30*a*) forming the via conductor 40 and the seed layer (30*a*) forming the second conductor layer 30 are common. The first layer (31*a*) forming the via conductor 40 and the first layer (31*a*) forming the second conductor layer 30 are common. The first layer (31*a*) is in contact with the inner wall surface 27. The second layer (31*b*) forming the via conductor 40 and the second layer (31*b*) forming the second conductor layer 30 are common. The electrolytic plating layer (30*b*) forming the via conductor 40 and the electrolytic plating layer (30*b*) forming the second conductor layer 30 are common.

The first layer (11*a*) forming the first conductor layer 10, the first layer (31*a*) forming the second conductor layer 30, and the first layer (31*a*) forming the via conductor 40 are similar. The first layers (11*a*, 31*a*) are formed of the same elements. Contents of each of the elements forming the first layers (11*a*, 31*a*) are similar. The second layer (11*b*) forming the first conductor layer 10, the second layer (31*b*) forming the second conductor layer 30, and the second layer (31*b*) forming the via conductor 40 are similar. The second layers (11*b*, 31*b*) are formed of the same elements. The second layers (11*b*, 31*b*) are formed of substantially the same amounts of the elements. The electrolytic plating layer (10*b*)

forming the first conductor layer 10, the electrolytic plating layer (30*b*) forming the second conductor layer 30, and the electrolytic plating layer (30*b*) forming the via conductor 40 are similar. The electrolytic plating layers (10*b*, 30*b*) are formed of the same elements. The electrolytic plating layers (10*b*, 30*b*) are formed of substantially the same amounts of the elements.

As illustrated in FIG. 1, the embodiment can form an adhesive layer 100 on a surface (including upper and side surfaces) of the second conductor layer 30. The surface of the second conductor layer 30 is formed of a first surface and a second surface. Of the surface, the first surface is a portion that is exposed by an opening 126 for the via conductor 140. The via conductor 140 penetrates the second resin insulating layer 120 and reaches the second conductor layer 30. The second surface is a portion other than the first surface. The first surface is not covered by the adhesive layer 100, and the second surface is covered by the adhesive layer 100. The adhesive layer 100 is in contact with the second conductor layer 30. The adhesive layer 100 is in contact with the second surface of the second conductor layer 30. The adhesive layer 100 is formed of resin. The adhesive layer 100 is formed of an organic material (organic resin). An example of the organic material is a nitrogen-based organic compound. The nitrogen-based organic compound is, for example, a tetrazole compound. Examples of the nitrogen-based organic compound are described in Japanese Patent Application Laid-Open Publication No. 2015-54987. The adhesive layer 100 does not cover the first surface 22 of the resin insulating layer 20 exposed from the second conductor layer 30. The adhesive layer 100 is formed between the second conductor layer 30 and the second resin insulating layer 120. The adhesive layer 100 is sandwiched between the second conductor layer 30 and the resin insulating layer (second resin insulating layer) 120. The adhesive layer 100 adheres the second conductor layer 30 and the second resin insulating layer 120.

Figure 4:
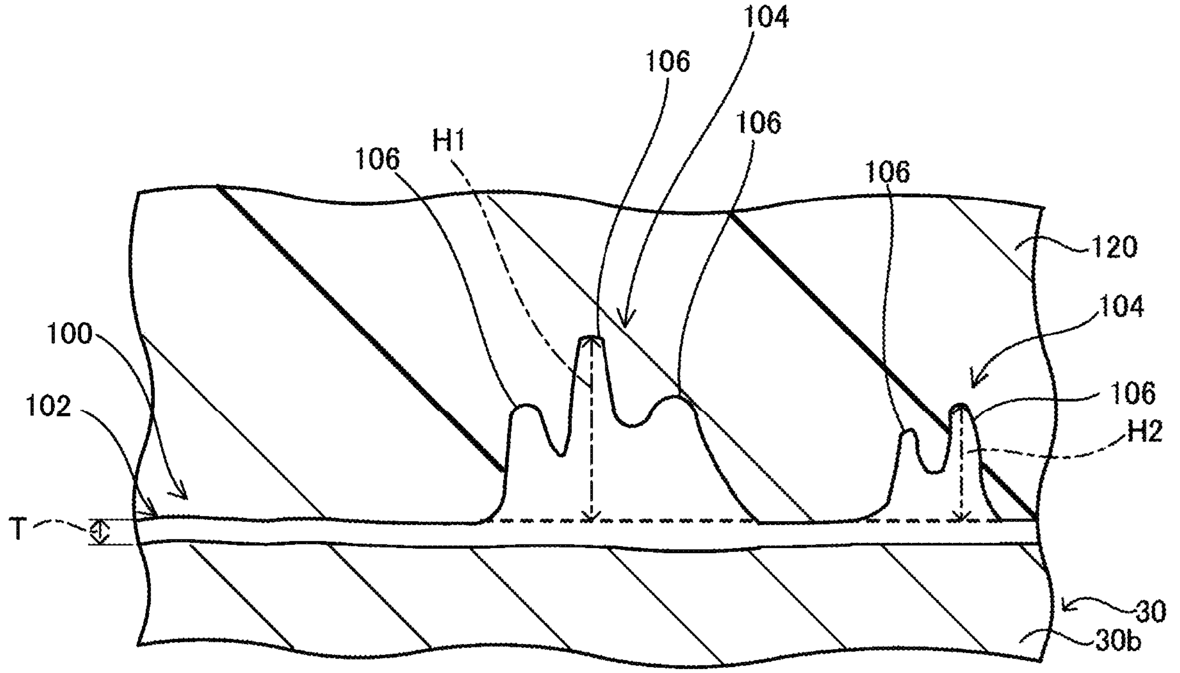
FIG. 4 is an enlarged cross-sectional view schematically illustrating a part of a printed wiring board according to an embodiment of the present invention.

FIG. 4 is an enlarged cross-sectional view illustrating a part of the adhesive layer 100 formed on the second surface of the second conductor layer 30. As illustrated in FIG. 4, the adhesive layer 100 is formed of a smooth film 102, which is substantially smooth, and multiple protruding parts 104 protruding from the smooth film 102.

The smooth film 102 has a substantially uniform thickness (T). The thickness (T) of the smooth film 102 is 10 nm or more and 120 nm or less. A ratio (S1/S2) of an area (S1) of the smooth film 102 exposed from the protruding parts 104 to an area (S2) of the adhesive layer 100 is 0.1 or more and 0.5 or less. The smooth film 102 on the second surface of the second conductor layer 30 is formed substantially along a shape of the second surface of the second conductor layer 30. When undulations are formed on the upper and side surfaces of the second conductor layer 30, the smooth film 102 follows the undulations.

The protruding parts 104 are each formed of multiple protrusions 106. Due to the multiple protrusions 106, unevenness is formed on upper surfaces of the protruding parts 104. The number of the protrusions 106 per 1 $mm^2$ is 5 or more and 15 or less. The protruding parts 104 have heights (H1, H2) between the upper surface of the smooth film 102 and top parts of the protruding parts 104. A maximum value of the heights (H1, H2) is 10 times or more and 30 times or less the thickness (T) of the smooth film 102. The heights (H1, H2) are 200 nm or more and 450 nm or less.

The second resin insulating layer 120 is formed on the second conductor layer 30 and the first surface 22 of the first resin insulating layer 20. The second resin insulating layer 120 is formed on the second conductor layer 30 via the adhesive layer 100. The second resin insulating layer 120 has a first surface 122 and a second surface 124 on an opposite side with respect to the first surface 122. The second surface 124 of the second resin insulating layer 120 faces the second conductor layer 30. The second resin insulating layer 120 has an opening (via conductor opening) 126. The opening 126 penetrates the second resin insulating layer 120 and reaches the second conductor layer 30.

The second resin insulating layer 120 is formed of a resin 80 and inorganic particles 90. The first resin insulating layer 20 and the second resin insulating layer 120 are similar. Therefore, the resin 80 forming the second resin insulating layer 120 and the resin 80 forming the first resin insulating layer 20 are similar. The inorganic particles 90 forming the second resin insulating layer 120 and the inorganic particles 90 forming the first resin insulating layer 20 are similar. Similar to the first resin insulating layer 20, the inorganic particles 90 forming the second resin insulating layer 120 include first inorganic particles 91, second inorganic particles 92 and third inorganic particles 93. The first inorganic particles 91 in the first resin insulating layer 20 and the first inorganic particles 91 in the second resin insulating layer 120 are similar. The second inorganic particles 92 in the first resin insulating layer 20 and the second inorganic particles 92 in the second resin insulating layer 120 are similar. The third inorganic particles 93 in the first resin insulating layer 20 and the third inorganic particles 93 in the second resin insulating layer 120 are similar.

The first surface 22 of the first resin insulating layer 20 and the first surface 122 of the second resin insulating layer 120 are similar. The first surface 122 of the resin insulating layer (second resin insulating layer) 120 is formed by an upper surface (second upper surface) of the resin 80 forming the resin insulating layer (second resin insulating layer) 120 and exposed surfaces (third exposed surfaces) of exposed portions of the first inorganic particles 91 forming the resin insulating layer (second resin insulating layer) 120. The second upper surface and the third exposed surfaces form a substantially common surface. Similar to the first surface 22 of the first resin insulating layer 20, the first surface 122 of the second resin insulating layer 120 can have steps (third steps) between the second upper surface and the third exposed surfaces. The first steps and the third steps are similar. The sizes of the first steps and sizes of the third steps are similar. Even when the first surface 122 has the steps, since the sizes of the steps are small, the upper surface (second upper surface) of the resin 80 and the exposed surfaces (third exposed surfaces) of the first inorganic particles 91 are positioned substantially on the same surface.

The opening (via conductor opening) 126 penetrating the second resin insulating layer 120 and the opening (via conductor opening) 26 penetrating the first resin insulating layer 20 are similar. Therefore, an inner wall surface (second inner wall surface) 127 of the opening 126 and the inner wall surface (first inner wall surface) 27 of the opening 26 are similar. The second inner wall surface 127 is formed by the resin 80 and the flat parts (93*a*) of the third inorganic particles 93. Similar to the first inner wall surface 27, the second inner wall surface 127 is formed by the surface (second resin surface) of the resin 80 forming the second inner wall surface 127 and the flat parts of the third inorganic particles 93 forming the second resin insulating layer 120. Similar to the flat parts (93*a*) of the third inorganic particles 93 forming the first resin insulating layer 20, the flat parts of the third inorganic particles 93 forming the second resin insulating layer 120 each have an exposed surface (fourth exposed surface). The second resin surface and the fourth exposed surfaces forming the inner wall surface 127 form a substantially common surface. Similar to the first inner wall surface 27, the second inner wall surface 127 can have steps (fourth steps) between the second resin surface and the fourth exposed surfaces. The second steps and the fourth steps are similar. Sizes of the fourth steps and the sizes of the second steps are similar. Thus, even when the second inner wall surface 127 has the fourth steps, the second resin surface and the fourth exposed surfaces form a substantially common surface.

As illustrated in FIG. 1, the third conductor layer 130 is formed on the first surface 122 of the second resin insulating layer 120. The via conductor (second via conductor) 140 that connects the second conductor layer 30 and the third conductor layer 130 is formed in the opening 126. The third conductor layer 130 and the second conductor layer 30 are similar. The second via conductor 140 and the first via conductor 40 are similar. The third conductor layer 130 and the second via conductor 140 are formed of a seed layer (130*a*) formed of a first layer (131*a*) and a second layer (131*b*) on the first layer (131*a*), and an electrolytic plating layer (130*b*) on the seed layer (130*a*). The first layer (131*a*) forming the third conductor layer 130 and the second via conductor 140 is similar to the first layer (31*a*) of the second conductor layer 30. The second layer (131*b*) forming the third conductor layer 130 and the second via conductor 140 is similar to the second layer (31*b*) of the second conductor layer 30. The electrolytic plating layer (130*b*) forming the third conductor layer 130 and the second via conductor 140 is similar to the electrolytic plating layer (30*b*) of the second conductor layer 30. The first layer (131*a*) is in contact with the first surface 122 of the second resin insulating layer 120. The first layer (131*a*) is in contact with the inner wall surface (second inner wall surface) 127. The layers (the first layer (31*a*), the second layer (31*b*), and the electrolytic plating layer (30*b*)) forming the second conductor layer 30 and the layers (the first layer (131*a*), the second layer (131*b*), and the electrolytic plating layer (130*b*)) forming the third conductor layer 130 have similar thicknesses and compositions. The layers (the first layer (31*a*), the second layer (31*b*), and the electrolytic plating layer (30*b*)) forming the second conductor layer 30 and the layers (the first layer (131*a*), the second layer (131*b*), and the electrolytic plating layer (130*b*)) forming the third conductor layer 130 are formed of the same elements. Contents of the elements contained in the layers (the first layer (31*a*), the second layer (31*b*), and the electrolytic plating layer (30*b*)) forming the second conductor layer 30 and contents of the elements contained in the layers (the first layer (131*a*), the second layer (131*b*), and the electrolytic plating layer (130*b*)) forming the third conductor layer 130 are similar.

A length of each side of the printed wiring board 2 is 50 mm or more. The length of each side is preferably 100 mm or more. The length of each side is 250 mm or less.

The printed wiring board 2 can have a solder resist layer on the first surface 122 of the second resin insulating layer 120 and on the third conductor layer 130. The insulating layer 4 may form a core material. The embodiment may have an adhesive layer 100 covering the second surface of the third conductor layer 130. The adhesive layer 100 is sandwiched between the third conductor layer 130 and the solder resist layer.

Method for Manufacturing Printed Wiring Board

Figure 5A:
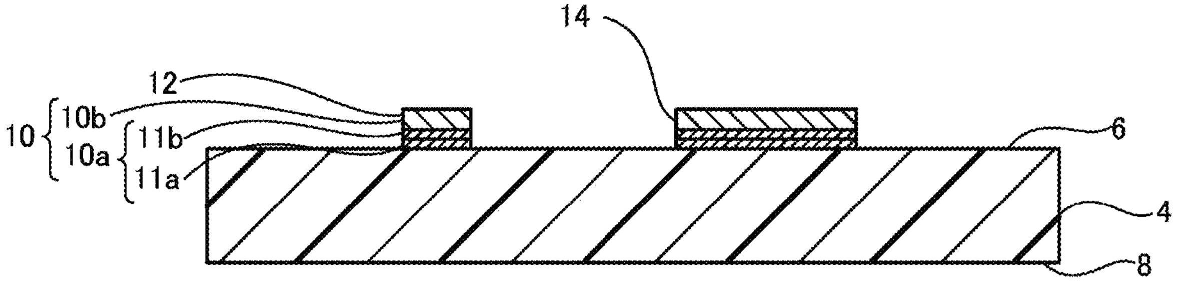
FIG. 5A is a cross-sectional view schematically illustrating a method for manufacturing a printed wiring board according to an embodiment of the present invention.
Figure 5B:
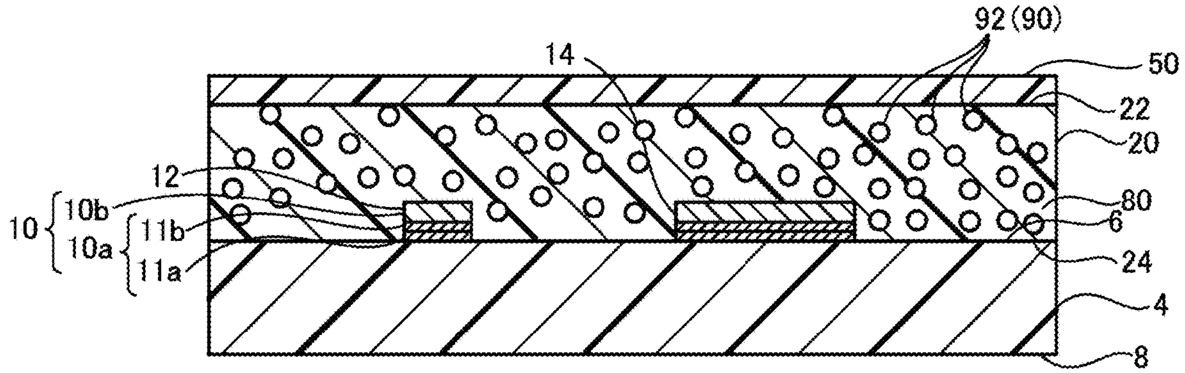
FIG. 5B is a cross-sectional view schematically illustrating a method for manufacturing a printed wiring board according to an embodiment of the present invention.
Figure 5C:
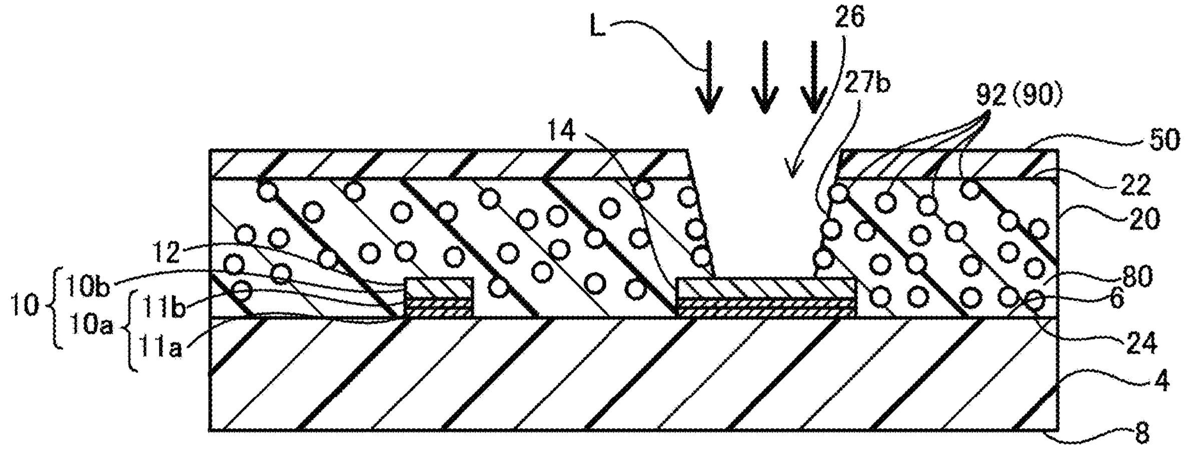
FIG. 5C is a cross-sectional view schematically illustrating a method for manufacturing a printed wiring board according to an embodiment of the present invention.
Figure 5D:
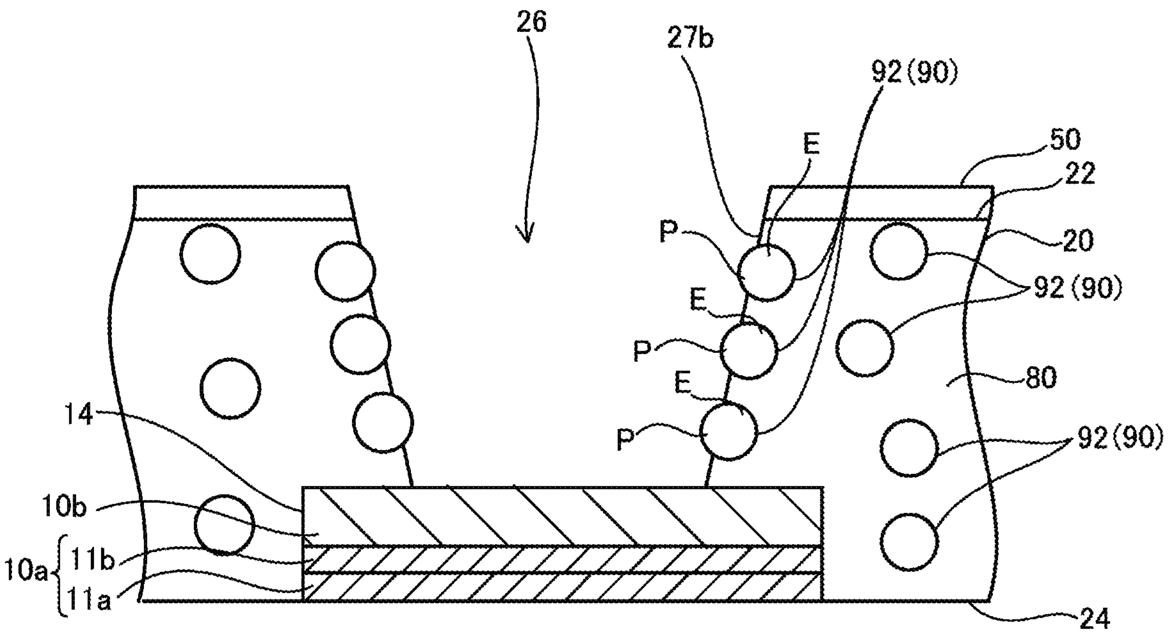
FIG. 5D is an enlarged cross-sectional view schematically illustrating a method for manufacturing a printed wiring board according to an embodiment of the present invention.
Figure 5E:
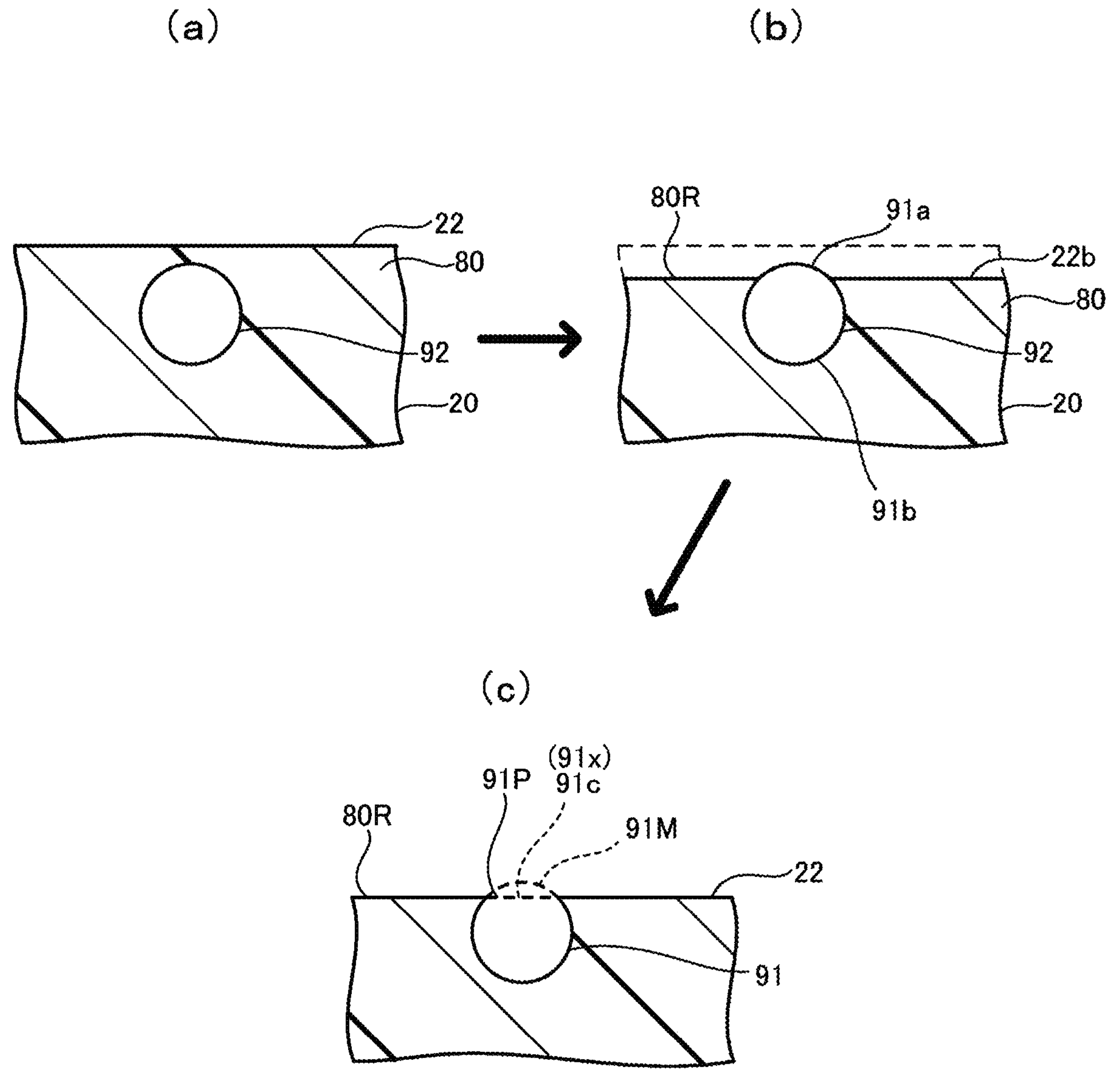
FIG. 5E is an enlarged cross-sectional view schematically illustrating a method for manufacturing a printed wiring board according to an embodiment of the present invention.

FIGS. 5A-5F illustrate a method for manufacturing the printed wiring board 2 of the embodiment according to an embodiment of the present invention. FIGS. 5A-5C and 5F are cross-sectional views. FIGS. 5D and 5E are enlarged cross-sectional views. FIG. 5A illustrates the insulating layer 4 and the conductor layer (first conductor layer) 10 formed on the third surface 6 of the insulating layer 4. The first conductor layer 10 is formed using a semi-additive method. The first layer (11*a*) and the second layer (11*b*) are formed by sputtering. The first layer (11*a*) and the second layer (11*b*) are formed in vacuum. The electrolytic plating layer (10*b*) is formed by electrolytic plating.

As illustrated in FIG. 5B, the resin insulating layer (first resin insulating layer) 20 and a protective film 50 are formed on the insulating layer 4 and the first conductor layer 10. The second surface 24 of the resin insulating layer 20 faces the third surface 6 of the insulating layer 4. The protective film 50 is formed on the first surface 22 of the first resin insulating layer 20. The resin insulating layer 20 contains the resin 80 and the inorganic particles 90. The inorganic particles 90 are embedded in the resin 80. An example of the inorganic particles 90 is glass particles.

The protective film 50 completely covers the first surface 22 of the resin insulating layer 20. An example of the protective film 50 is a film formed of polyethylene terephthalate (PET). A release agent is formed between the protective film 50 and the resin insulating layer 20.

As illustrated in FIG. 5C, laser (L) is irradiated from above the protective film 50. The laser (L) penetrates the protective film 50 and the resin insulating layer 20 at the same time. The opening (via conductor opening) 26 reaching the pad 14 of the first conductor layer 10 is formed. The laser (L) is, for example, UV laser, or $CO_2$ laser. The pad 14 is exposed from the opening 26. When the opening 26 is formed, the first surface 22 is covered by the protective film 50. Therefore, when the opening 26 is formed, even when the resin scatters, adherence of the resin to the first surface 22 is suppressed.

FIG. 5D illustrates an inner wall surface (27*b*) of the opening 26 after the laser irradiation. By irradiating the resin insulating layer 20 with the laser (L), some of the second inorganic particles 92 embedded in the resin 80 form the inner wall surface (27*b*) after the laser irradiation. The inner wall surface (27*b*) is formed of the resin 80 and the inorganic particles 90 protruding from the resin 80. Some of the second inorganic particles embedded in the resin insulating layer 20 partially protrude from the inner wall surface (27*b*). The second inorganic particles 92 forming the inner wall surface (27*b*) after the laser irradiation are each formed of a protruding portion (P) protruding from the resin 80 and a portion (E) embedded in the resin 80. The second inorganic particles 92 forming the inner wall surface (27*b*) are referred to as third protruding particles.

Figure 5F:
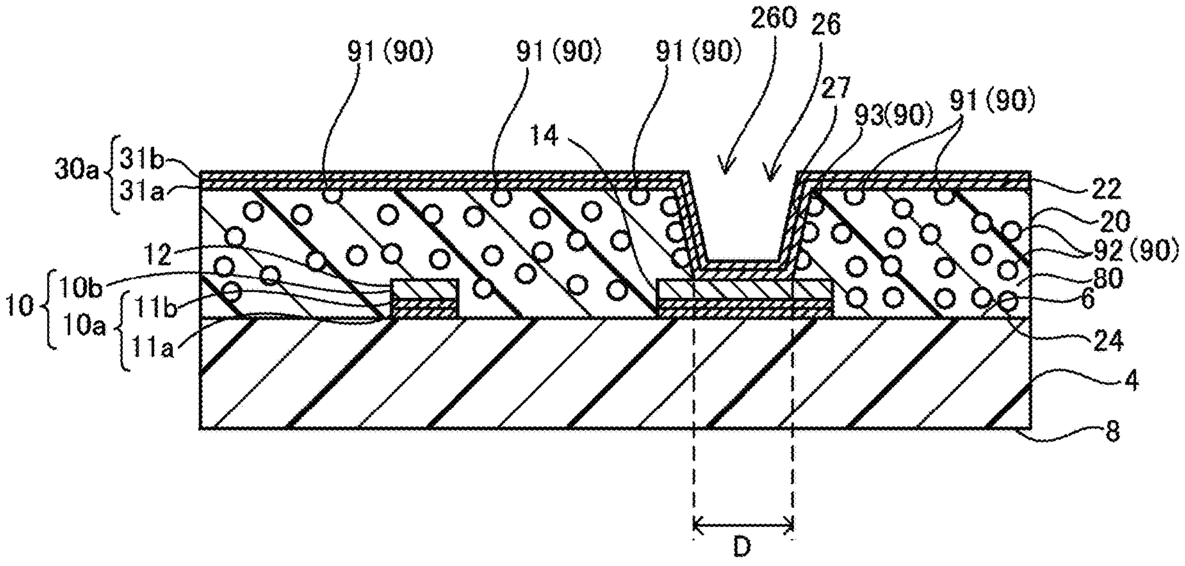
FIG. 5F is a cross-sectional view schematically illustrating a method for manufacturing a printed wiring board according to an embodiment of the present invention.

The protective film is removed. After removing the protective film 50, the first surface 22 of the resin insulating layer 20 is cleaned. The resin 80 forming the first surface 22 is removed by a dry process. For example, the first surface 22 of the resin insulating layer 20 is cleaned by reverse sputtering. For example, cleaning the first surface 22 of the resin insulating layer 20 is performed by sputtering using an argon gas (argon sputtering). FIGS. 5F(a) and 5F(b) schematically illustrate the first surface 22 of the resin insulating layer 20 before and after the cleaning. As illustrated in FIGS. 5F(a) and 5F(b), about 20 nm of the resin 80 forming the resin insulating layer 20 is removed by the cleaning by sputtering or the like. For example, an adhesive used to adhere the protective film 50 to the resin insulating layer 20 is removed. By the cleaning, the resin 80 is selectively removed. The resin 80 is reduced in thickness. Some of the inorganic particles 90 are partially exposed from the upper surface (80R) of the resin 80 by the cleaning. Some of the second inorganic particles 92 are exposed from the upper surface (80R) of the resin 80. FIG. 5E(b) illustrates the first surface (22*b*) after the cleaning. As illustrated in FIG. 5E(b), the inorganic particles (second inorganic particles 92) 90 that form the first surface (22*b*) after the cleaning are each formed of a first portion (91*a*) that protrudes from the resin 80 and a second portion (91*b*) that is embedded in the resin 80. The second inorganic particles 92 that form the first surface (22*b*) after the cleaning are referred to as first protruding particles.

In order to control a shape of the inner wall surface, the inner wall surface (27*b*) after the laser irradiation is treated. In order to control a shape of the first surface, the first surface (22*b*) after the cleaning is treated. It is preferable that the first protruding particles and the third protruding particles are selectively removed. As a result, the first inorganic particles 91 are formed from the inorganic particles 90. The third inorganic particles 93 are formed from the inorganic particles 90. For example, the first protruding particles and the third protruding particles are selectively removed by treating the inner wall surface (27*b*) after the laser irradiation and the first surface (22*b*) after the cleaning with a chemical. Or, the first protruding particles and the third protruding particles are selectively removed by treating the inner wall surface (27*b*) after the laser irradiation and the first surface (22*b*) after the cleaning with plasma. The selectively removing includes that an etching rate of the inorganic particles 90 is greater than an etching rate of the resin 80. For example, a difference in etching rate between the two is 10 or more times. Or, the difference in etching rate between the two is 50 or more times. Or, the difference in etching rate between the two is 100 or more times. By treating the first surface (22*b*) after the cleaning, the first inorganic particles 91 having the exposed portions (91P) are obtained. By treating the inner wall surface (27*b*) after the laser irradiation, the third inorganic particles 93 having the flat parts (93*a*) are obtained. By controlling conditions for treating the first surface (22*b*) after the cleaning, the embodiment can control the shape of the first surface 22. By controlling conditions for treating the inner wall surface (27*b*) after the laser irradiation, the embodiment can control the shape of the inner wall surface 27. Examples of the conditions are a temperature, a concentration, a time, a type of gas, and a pressure. The etching rate of the inorganic particles 90 and the etching rate of the resin are controlled.

The inner wall surface (27*b*) after the laser irradiation is treated. For example, the inner wall surface (27*b*) is treated with plasma of a gas containing tetrafluoromethane. By selectively removing the protruding portions (P), the inner wall surface 27 of the embodiment is formed. The third inorganic particles 93 are formed from the second inorganic particles 92. By selectively removing the protruding portions (P), the third inorganic particles 93 having the flat parts (93*a*) are formed. The surface forming the flat parts (93*a*) is a substantially flat surface. The surface forming the flat parts (93*a*) is a substantially curved surface. When the second inorganic particles 92 having spherical shapes are cut along a flat surface, the shapes of the third inorganic particles 93 are obtained. Or, the second inorganic particles 92 are cut along a curved surface. The third inorganic particles 93 each have a substantially spherical segment shape. The inner wall surface 27 is formed by the flat parts (93*a*) and the surface (80*a*) of the resin 80. Exposed surfaces (93*b*) of the flat parts (93*a*) and the surface (80*a*) of the resin 80 are positioned substantially on the same plane. For example, when the seed layer (30*a*) is formed on the inner wall surface (27*b*) by sputtering, the protruding portions (P) inhibit growth of a sputtered film. For example, it is difficult to form a continuous seed layer (30*a*) on the inner wall surface (27*b*). Or, the seed layer (30*a*) is increased in thickness. It is thought that in a printed wiring board having the third protruding particles, fine conductive circuits cannot be formed on the first surface 22. In the embodiment, the protruding portions (P) are removed. The embodiment can reduce the thickness of the seed layer (30*a*) formed by sputtering. Even when the seed layer (30*a*) formed by sputtering is thin, a continuous seed layer (30*a*) can be obtained. The seed layer (30*a*) has a thickness of 0.05 μm or more and less than 0.5 μm.

Forming the opening 26 includes forming the inorganic particles 90 (the second inorganic particles 92) having the protruding portions (P). The protruding portions (P) protrude from the resin 80 that forms the inner wall surface (27*b*) of the opening 26. The third inorganic particles 93 are formed by removing the protruding portions (P) of the inorganic particles 90 (the second inorganic particles 92). The inner wall surface 27 of the opening 26 includes the exposed surfaces (93*b*) of the third inorganic particles 93. The exposed surfaces (93*b*) of the third inorganic particles 93 are formed by removing the protruding portions (P).

Obtaining the shapes of the third inorganic particles 93 by cutting the second inorganic particles 92 having spherical shapes along a flat surface includes removing the protruding portions (P) of the inorganic particles 90. The inner wall surface 27 of the opening 26 is actually a substantially curved surface. Since the flat parts (93*a*) are formed by removing the protruding portions (P), the exposed surfaces (93*b*) of the flat parts (93*a*) each include a curved surface. That is, forming a common surface with the flat parts (93*a*) and the resin 80 includes forming the inner wall surface 27 formed with a substantially curved surface.

The first surface (22*b*) after the cleaning is treated. For example, the first surface (22*b*) is treated with plasma of a gas containing tetrafluoromethane. By selectively removing the first portions (91*a*), the first surface 22 of the embodiment is formed. The first inorganic particles 91 are formed from the second inorganic particles 92. As illustrated in FIG. 5E(c), by selectively removing the first portion (91*a*), the first inorganic particle 91 having the exposed portion (91P) is formed. The exposed surface (first exposed surface) (91*x*) of the exposed portion (91P) is a substantially flat surface. It is also possible that the first exposed surface (91*x*) is a substantially curved surface. When the second inorganic particles 92 having spherical shapes are cut along a flat surface, the shapes of the first inorganic particles 91 are obtained. Or, the second inorganic particles 92 are cut along a curved surface. The first surface 22 is formed by the exposed portions (91P) and the upper surface (80R) of the resin 80. The first exposed surfaces (91*x*) of the exposed portions (91P) and the upper surface (80R) of the resin 80 are positioned on substantially the same surface. For example, when the seed layer (30*a*) is formed on the first surface (22*b*) by sputtering, the first portions (91*a*) inhibit growth of a sputtered film. For example, it is difficult to form a continuous seed layer (30*a*) on the first surface (22*b*). Or, the seed layer (30*a*) is increased in thickness. It is thought that in a printed wiring board having the first protruding particles, fine conductive circuits cannot be formed on the first surface 22. In the embodiment, the first portions (91*a*) are removed. The embodiment can reduce the thickness of the seed layer (30*a*) formed by sputtering. Even when the seed layer (30*a*) formed by sputtering is thin, a continuous seed layer (30*a*) can be obtained. The seed layer (30*a*) has a thickness of 0.05 μm or more and less than 0.5 μm.

Forming the first surface 22 includes forming the inorganic particles (second inorganic particles 92) 90 having the first portions (91*a*). The first portions (91*a*) protrude from the upper surface (80R) of the resin 80. The first inorganic particles 91 are formed by removing the first portions (91*a*) of the inorganic particles (second inorganic particles 92) 90. The first surface 22 includes the exposed surfaces (91*x*) of the first inorganic particles 91. The exposed surfaces (91*x*) of the first inorganic particles 91 are formed by removing the first portions (91*a*).

Obtaining the shapes of the first inorganic particles 91 by cutting the second inorganic particles 92 having spherical shapes along a flat surface includes removing the first portions (91*a*) of the inorganic particles 90. Since the exposed portions (91P) are formed by removing the first portions (91*a*), the exposed surfaces (91*x*) of the exposed portions (91P) each include a curved surface. That is, the exposed surfaces (91*x*) each include a substantially curved surface.

For example, using FIG. 5E(c), the ratio (R) ((the volume of the first inorganic particle)/(the volume of the assumed sphere)) is determined. The cross-sectional view in FIG. 5E is perpendicular to the first surface 22. The outer perimeter of the first inorganic particles 91 is depicted with a solid line and a broken line. The first exposed surface (91*x*) is depicted with a broken line, while the outer periphery of the portion other than the first exposed surface (91*x*) is depicted with a solid line. Using the cross-sectional view of the first inorganic particle 91 in FIG. 5E(c), a circle (assumed circle) (91M) is envisioned. A circumference of the assumed circle (91M) is depicted with a dotted line and a solid line. A portion illustrated with the dotted line represents a portion predicted from the first inorganic particle 91. The first inorganic particle 91 has a spherical segment shape. Since the shape of the first inorganic particle 91 originates from a sphere, the assumed circle can be relatively easily predicted. An area of the first inorganic particle 91 in FIG. 5E(c) is determined. An area of the assumed circle in FIG. 5E(c) is determined. A ratio between the two ((area of the first inorganic particle 91)/(area of the assumed circle (91M))) can represent the ratio (R). For example, the ratio (R) is 0.95. The first exposed surface (91*x*) in FIG. 5E(c) is covered by the conductor layer.

The inner wall surface (27*b*) after the laser irradiation and the first surface (22*b*) after the cleaning are treated at the same time. The inner wall surface (27*b*) after the laser irradiation and the first surface (22*b*) after the cleaning are treated separately. When treated separately, both are treated using the same method. Or, the two are treated using different methods.

When the inner wall surface (27*b*) after the laser irradiation is treated, the surface is substantially not roughened. The inner wall surface 27 has substantially no unevenness. The inner wall surface 27 is formed smooth. The surface (80*a*) of the resin 80 that forms the inner wall surface 27 is formed smooth. The surface (80*a*) of the resin 80 has substantially no unevenness. The surface (80*a*) of the resin 80 has an arithmetic mean roughness (Ra) of 0.2 μm or less. By controlling the conditions for treating the inner wall surface (27*b*) after the laser irradiation, a size of unevenness is controlled.

When the first surface (22*b*) after the cleaning is treated, the first surface 22 is substantially not roughened. The first surface 22 has substantially no unevenness. The first surface 22 is formed smooth. The upper surface (80R) of the resin 80 that forms the first surface 22 is formed smooth. The upper surface (80R) of the resin 80 has substantially no unevenness. The upper surface (80R) of the resin 80 has an arithmetic mean roughness (Ra) of 0.2 μm or less. By controlling the conditions for treating the first surface (22*b*) after the cleaning, a size of the unevenness is controlled.

The embodiment can clean the inside of the opening 26. The cleaning of the inside of the opening 26 is performed using plasma. That is, the cleaning is performed by a dry process. The cleaning includes a desmear treatment. When treating the inner wall surface (27*b*) after the laser irradiation includes cleaning the inside of the opening 26, the embodiment can omit the cleaning of the inside of the opening 26. When treating the first surface (22*b*) after the cleaning includes cleaning the inside of the opening 26, the embodiment can omit the cleaning of the inside of the opening 26. The embodiment can omit the desmear treatment.

As illustrated in FIG. 5F, the seed layer (30*a*) is formed on the first surface 22 of the resin insulating layer 20. The seed layer (30*a*) is formed by sputtering. The formation of the seed layer (30*a*) is performed with a dry process. The first layer (31*a*) is formed on the first surface 22 by sputtering. At the same time, the first layer (31*a*) is formed on the inner wall surface 27 and the pad 14, which are exposed from the opening 26, by sputtering. Substantially no recesses are formed on the first surface 22. Therefore, the first layer (31*a*) on the first surface 22 is formed substantially flat. After that, the second layer (31*b*) is formed on the first layer (31*a*) by sputtering. The second layer (31*b*) is formed substantially flat. The first layer (31*a*) and the second layer (31*b*) are formed in vacuum. The seed layer (30*a*) is also formed on the upper surface of the pad 14 exposed from the opening 26 and on the inner wall surface 27 of the opening 26. The first layer (31*a*) is formed of an alloy containing copper and aluminum. Aluminum has high ductility and high malleability. Therefore, adhesion between resin insulating layer 20 and the first layer (31*a*) is high. It is thought that, even when the resin insulating layer 20 expands and contracts due to heat cycles, the seed layer (30*a*) containing aluminum can follow the expansion and contraction. Even when the first surface 22 of the resin insulating layer 20 is smooth, the seed layer (30*a*) is unlikely to peel off from the resin insulating layer 20. It is thought that aluminum is easily oxidized. It is thought that, when the third inorganic particles 93 are inorganic particles 90 containing oxygen (oxygen elements), the first layer (31*a*) formed on the inner wall surface 27 adheres to the third inorganic particles 93 via the oxygen in the inorganic particles 90 forming the inner wall surface 27. The first layer (31*a*) and the inner wall surface 27 are strongly bonded to each other. The embodiment can increase adhesion between the inner wall surface 27 and the first layer (31*a*). The seed layer (30*a*) is unlikely to peel off from the inner wall surface 27. The third inorganic particles 93 forming the inner wall surface 27 preferably contain oxygen elements. It is thought that, when the first inorganic particles 91 are inorganic particles 90 containing oxygen (oxygen elements), the first layer (31*a*) formed on the first surface 22 adheres to the first inorganic particles 91 via the oxygen in the inorganic particles 90 forming the first surface 22. The first layer (31*a*) and the first surface 22 are strongly bonded to each other. The embodiment can increase adhesion between the first surface 22 and the first layer (31*a*). The seed layer (30*a*) is unlikely to peel off from the first surface 22. The first inorganic particles 91 forming the first surface 22 preferably contain oxygen elements. The first layer (31*a*) can further contain silicon. In this case, silicon is a specific metal, and the first layer (31*a*) is formed of an alloy containing copper, aluminum, and silicon. When the inorganic particles 90 are glass particles, both the first layer (31*a*) and the first inorganic particles 91 contain silicon. It is thought that the two are strongly bonded to each other via silicon. It is thought that the embodiment can further increase adhesive strength between the first layer (31*a*) and the first surface 22. The first layer (31*a*) and the third inorganic 93 both contain silicon. It is thought that the two are strongly bonded to each other via silicon. It is thought that the embodiment can further increase adhesive strength between the first layer (31*a*) and the inner wall surface 27. The second layer (31*b*) is formed of copper.

The first surface 22 has substantially no recesses. The inner wall surface 27 has substantially no recesses. The first surface 22 is formed substantially smooth. The inner wall surface 27 is formed substantially smooth. Therefore, even when the sputtered films (the first layer (31*a*) and the second layer (31*b*)) are thin, the embodiment can form a continuous seed layer (30*a*). As a result, the embodiment can form fine wirings.

A plating resist is formed on the seed layer (30*a*). The plating resist has openings for forming the first signal wiring 32, the second signal wiring 34, and the land 36. When the first surface 22 has recesses, air caused by the recesses is likely to be trapped between the plating resist and the seed layer (30*a*). However, in the embodiment, the first surface 22 has substantially no recesses. Therefore, the seed layer (30*a*) on the first surface 22 is formed substantially flat. The seed layer (30*a*) has substantially no recesses. Air is unlikely to remain between the plating resist and the seed layer (30*a*). A contact area between the plating resist and the seed layer (30*a*) is large. Even when a width of the plating resist for forming a space between the first signal wiring 32 and the second signal wiring 34 is 10 μm or less, the plating resist is unlikely to peel off from an upper surface of the seed layer (30*a*). Even when the width of the plating resist is 3 μm or more and 8 μm or less, the embodiment can form the plating resist on the seed layer (30*a*). Even when the width of the plating resist is 6 μm or less, the plating resist is unlikely to peel off from the seed layer (30*a*).

The electrolytic plating layer (30*b*) is formed on the seed layer (30*a*) exposed from the plating resist. The electrolytic plating layer (30*b*) is formed of copper. The electrolytic plating layer (30*b*) fills the opening 26. The first signal wiring 32, the second signal wiring 34, and the land 36 are formed by the seed layer (30*a*) and the electrolytic plating film (30*b*) on the first surface 22. The second conductor layer 30 is formed. The via conductor (first via conductor) 40 is formed by the seed layer (30*a*) and the electrolytic plating film (30*b*) in the opening 26. The via conductor 40 connects the pad 14 and the land 36. The first signal wiring 32 and the second signal wiring 34 form a pair wiring. The first via conductor 40 connects the conductor layer (first conductor layer) 10 and the conductor layer (second conductor layer) 30.

The plating resist is removed. The seed layer (30*a*) exposed from the electrolytic plating layer (30*b*) is removed. The seed layer (30*a*) is removed by wet etching. An etching solution used in the wet etching is an aqueous solution containing hydrogen peroxide and sulfuric acid. By the wet etching, the first layer (31*a*) and the second layer (31*b*) are removed at the same time. The second conductor layer 30 and the via conductor 40 are formed at the same time.

The adhesive layer 100 is formed on upper and side surfaces of the second conductor layer 30. The adhesive layer 100 is formed by immersing an intermediate substrate having the second conductor layer 30 and the via conductor 40 in a chemical solution containing a nitrogen-based organic compound. The chemical solution has a pH or 7 or less. By immersing the intermediate substrate in the chemical solution, the adhesive layer 100 including the smoothing film 102 and the protruding parts 104 is formed on the upper and side surfaces of the second conductor layer 30. Before the intermediate substrate is immersed in the chemical solution, an oxide film on the upper and side surfaces of the second conductor layer 30 is removed. In a modified example, the adhesive layer 100 is formed by applying a chemical solution on the second conductor layer 30. When the adhesive layer 100 is formed, the intermediate substrate is taken out from the chemical solution. The adhesive layer 100 is dried. The upper surface of the adhesive layer 100 before the drying may be smooth. In this case, by the drying, a part of the adhesive layer aggregates. By the aggregating, the adhesive layer 100 including the smooth film 102 and the protruding parts 104 is formed.

The resin insulating layer (second resin insulating layer) 120 is formed on the first surface 22 of the first resin insulating layer 20 and on the second conductor layer 30, which is covered by the adhesive layer 100, using the same method as the first resin insulating layer 20. The second resin insulating layer 120 has the first surface 122, the second surface 124 on an opposite side with respect to the first surface 122, and the opening (via conductor opening) 126. The second surface 124 of the second resin insulating layer 120 faces the second conductor layer 30. When the opening 126 is formed in the resin insulating layer 120 using the laser (L), the laser (L) removes the adhesive layer 100 covering the second conductor layer 30. Or, the adhesive layer 100 is not completely removed by the laser (L). In this case, by cleaning the inside of the opening 126, the adhesive layer 100 at the bottom of the opening 126 is removed. The second conductor layer 30 is exposed by the opening 126. The conductor layer (third conductor layer) 130 is formed on the first surface 122 of the second resin insulating layer 120 using the same method as the second conductor layer 30. The via conductor (second via conductor) 140 that connects the second conductor layer 30 and the third conductor layer 130 is formed in the opening (second opening) 126 using the same method as the first via conductor 40. The printed wiring board 2 of the embodiment is obtained.

The resin insulating layers are each formed of a resin 80 and inorganic particles 90. The resin forming each of the resin insulating layers and the resin 80 forming the first resin insulating layer 20 are similar. The inorganic particles forming each of the resin insulating layers and the inorganic particles 90 forming the first resin insulating layer 20 are similar. The resin insulating layers each include first inorganic particles, second inorganic particles, and third inorganic particles. The particles in each of the resin insulating layers and the particles in the first resin insulating layer 20 are similar. The resin insulating layers each have a first surface. The first surface of each of the resin insulating layers and the first surface 22 of the first resin insulating layer 20 are similar. The resin insulating layers each have an opening (via conductor opening). The opening penetrating each of the resin insulating layers and the opening 26 penetrating the first resin insulating layer are similar. An inner wall surface of the opening penetrating each of the resin insulating layers and the inner wall surface 27 of the opening 26 penetrating the first resin insulating layer 20 are similar.

The conductor layers are each formed of a seed layer and an electrolytic plating layer on the seed layer. The seed layer forming each of the conductor layers and the seed layer (30*a*) forming the second conductor layer 30 are similar. The first layer forming each of the conductor layers and the first layer (31*a*) forming the second conductor layer 30 are similar. The second layer forming each of the conductor layers and the second layer (31*b*) forming the second conductor layer 30 are similar. The electrolytic plating layer forming each of the conductor layers and the electrolytic plating layer (30*b*) forming the second conductor layer 30 are similar.

The via conductors are each formed of a seed layer and an electrolytic plating layer on the seed layer. The seed layer forming each of the via conductors and the seed layer (30*a*) forming the first via conductor 40 are similar. The first layer forming each of the via conductors and the first layer (31*a*) forming the first via conductor 40 are similar. The second layer forming each of the via conductors and the second layer (31*b*) forming the first via conductor 40 are similar. The electrolytic plating layer forming each of the via conductors and the electrolytic plating layer (30*b*) forming the first via conductor 40 are similar.

In the printed wiring board 2 of the embodiment, even when a sputtered film is thin, the embodiment can form a continuous seed layer (30*a*). The inner wall surface 27 of the opening 26 is formed by the flat parts (93*a*) of the third inorganic particles 93 and the resin 80. The flat parts (93*a*) and the surface (80*a*) of the resin 80 that forms the inner wall surface 27 form a common surface. The inner wall surface 27 is formed smooth. Therefore, the seed layer (30*a*) having a uniform thickness is formed on the inner wall surface 27 of the opening 26. The seed layer (30*a*) is formed thin. The first surface 22 is formed by the exposed portions (91P) of the first inorganic particles 91 and the upper surface (80R) of the resin 80. The exposed surfaces (91*x*) and the upper surface (80R) of the resin 80 form a common surface. The first surface 22 is formed smooth. Therefore, the seed layer (30*a*) having a uniform thickness is formed on the first surface 22. The seed layer (30*a*) is formed thin. When the seed layer (30*a*) is removed, an etching amount is small. Therefore, an etching amount of the electrolytic plating layer (30*b*) is small. The second conductor layer 30 having the first signal wiring 32 and the second signal wiring 34 has a width as designed. Fine wirings are formed. A high quality printed wiring board 2 is provided.

When the first layer (31*a*) of the seed layer (30*a*) contains aluminum and the third inorganic particles 93 contain oxygen elements, the embodiment can increase the adhesive strength between the first layer (31*a*) and the inner wall surface 27. Even when the opening 26 has a small diameter, the via conductor 40 is unlikely to peel off from the inner wall surface 27. Therefore, connection resistance via the via conductor 40 is unlikely to increase. As illustrated in FIG. 5F, a diameter (D) of the via conductor 40 (the diameter of the opening 26) is measured on the pad 14. The diameters (D) are 20 μm or more and 50 μm or less. Even when a length of each side of the printed wiring board 2 exceeds 50 mm, the connection resistance via the via conductor 40 is unlikely to increase. Even when the length of each side of the printed wiring board 2 is 100 mm or more, the connection resistance is unlikely to increase for a long period. A printed wiring board 2 with high connection reliability is provided.

The embodiment can reduce the thickness of the first layer (31*a*) forming the via conductor 40. The embodiment can reduce the thickness of the second layer (31*b*) forming the via conductor 40. The first layer (31*a*) and the second layer (31*b*) form the seed layer (30*a*). The embodiment can increase a volume of the via conductor opening after the formation of the seed layer. The via conductor opening after the formation of the seed layer may be referred to as a post-seed layer formation opening. By forming an electrolytic plating layer in the post-seed layer formation opening, a via conductor formed of the seed layer and the electrolytic plating layer is formed. Even when the via conductor opening has a small diameter, an electrolytic plating solution can easily enter the post-seed layer formation via conductor opening. The electrolytic plating layer forming the via conductor is unlikely to contain a void. A low resistance via conductor is formed. An example of a post-seed layer formation opening 260 is illustrated in FIG. 5F. The post-seed layer formation opening 260 is surrounded by the seed layer. The bottom and side surface of the opening 260 are in contact with the seed layer.

The embodiment can reduce the thickness of the first layer (31*a*) formed of an alloy containing aluminum. In the signal wirings, a content of aluminum is low and a content of copper is high. The embodiment can provide low-resistance signal wirings. The embodiment can provide low-resistance signal wirings with high adhesion to the resin insulating layers.

In the printed wiring board 2 of the embodiment, the first surface 22 of the resin insulating layer 20 has substantially no recesses. An increase in standard deviation of a relative permittivity in a portion near the first surface 22 of the resin insulating layer 20 is suppressed. The relative permittivity of the first surface 22 of the resin insulating layer 20 does not significantly vary depending on a location. Even when the multiple signal wirings are in contact with the first surface 22 of the resin insulating layer 20, the embodiment can reduce a difference in electrical signal propagation speed between the signal wirings. Therefore, in the printed wiring board 2 of the embodiment, noise is suppressed. Even when a logic IC is mounted on the printed wiring board 2 of the embodiment, data transmitted via the signal wirings reaches the logic IC substantially simultaneously. The embodiment can suppress malfunction of the logic IC. Even when the signal wirings each have a length of 5 mm or more, the embodiment can reduce the difference in propagation speed. Even when the signal wirings each have a length of 10 mm or more and 20 mm or less, the embodiment can suppress malfunction of the logic IC. The first surface 122 of the second resin insulating layer 120 is also similar to the first surface 22 of the resin insulating layer 20. Therefore, signal wirings in the third conductor layer 130 also have similar effects as the signal wirings in the second conductor layer 30. A high quality printed wiring board 2 is provided.

The printed wiring board 2 of the embodiment has an adhesive layer between a conductor layer and a resin insulating layer. The adhesive layer adheres the conductor layer and the resin insulating layer. Therefore, even when upper and side surfaces of a signal wiring are smooth, the resin insulating layer is unlikely to peel off from the signal wiring. Preferably, the upper and side surfaces of the signal wiring are not roughened. The adhesive layer 100 is formed of the smooth film 102, which is substantially smooth, and the protruding parts 104 protruding from the smooth film 102. The adhesive layer 100 has unevenness formed by the protruding parts 104 and the smooth film 102. The adhesive layer 100 has unevenness formed by the multiple protrusions 106. Therefore, the second conductor layer 30 and the second resin insulating layer 120 are sufficiently adhered to each other via the adhesive layer 100. A high quality printed wiring board 2 is provided. For example, even when each side of the printed wiring board 2 has a length of 50 mm or more, the second resin insulating layer 120 is unlikely to peel off from the second conductor layer 30. Even when each side of the printed wiring board 2 has a length of 100 mm or more, a crack caused by the adhesive layer 100 is unlikely to occur in the second resin insulating layer 120. Even when the second conductor layer 30 includes a conductor circuit having a width of 5 μm or less, the second resin insulating layer 120 is unlikely to peel off from the second conductor layer 30. Even when the second conductor layer 30 includes a conductor circuit having a width of 3 μm or less, a crack caused by the adhesive layer 100 is unlikely to occur in the second resin insulating layer 120.

When the first layer contains silicon as the specific metal and the inorganic particles are glass particles, the first layer and the third inorganic particles 93 on the inner wall surface contain silicon. The first layer on the first surface and the first inorganic particles 91 contain silicon. It is thought that the two are strongly bonded to each other via silicon. The seed layer formed of an alloy containing copper, aluminum, and silicon is unlikely to peel off from the inner wall surface. The seed layer is unlikely to peel off from the first surface. The seed layer is unlikely to peel off from the resin insulating layer.

When the first layer contains aluminum and the inorganic particles 90 (the first inorganic particles 91, the second inorganic particles 92, and the third inorganic particles 93) contain oxygen, it is thought that the first layer and the inorganic particles 90 (oxygen-containing inorganic particles such as glass particles) are strongly bonded to each other. When the first layer contains aluminum and the inorganic particles 90 contain oxygen, the first layer may be formed of copper, aluminum, and impurities.

First Alternative Example

In a first alternative example of the embodiment, the specific metal is selected from titanium, nickel, chromium, tin and calcium.

Second Alternative Example

In a second alternative example of the embodiment, the first layers (11*a*, 31*a*) of the seed layers (10*a*, 30*a*) are each formed of copper and a second element. The second element is selected from silicon, aluminum, titanium, nickel, chromium, carbon, oxygen, tin, and calcium. The first layers (11*a*, 31*a*) are formed of an alloy containing copper. The second layers (11*b*, 31*b*) are formed of copper. A content of copper forming the second layers (11*b*, 31*b*) is 99.9 at % or more, The content of copper is preferably 99.95 at % or more.

Modified Example

Figure 6:
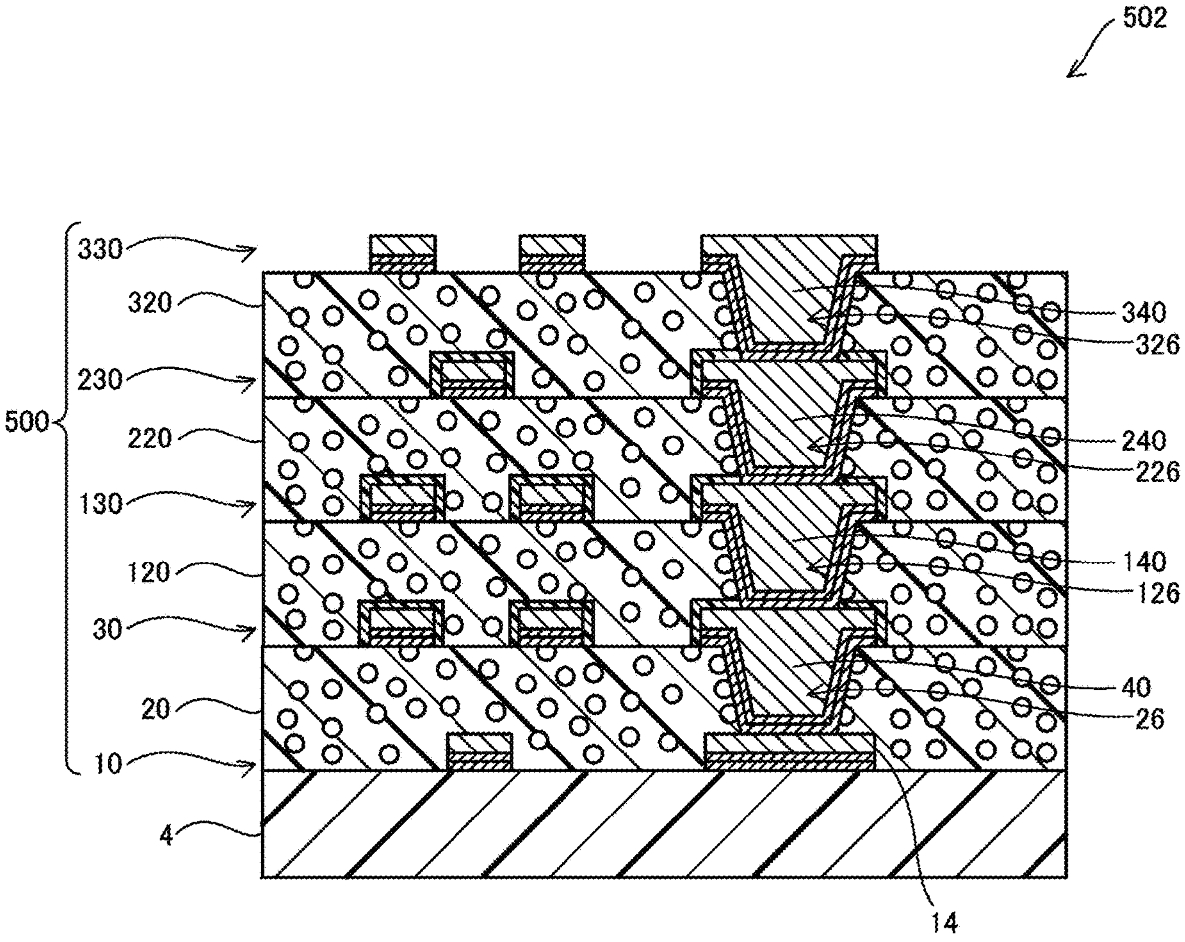
FIG. 6 is a cross-sectional view schematically illustrating a modified example of a printed wiring board according to an embodiment of the present invention.

FIG. 6 illustrates a modified example of the embodiment. As illustrated in FIG. 6, a printed wiring board 502 of the modified example has a build-up layer 500 on the insulating layer 4. The buildup layer 500 includes multiple conductor layers and multiple resin insulating layers. The conductor layers and the resin insulating layers are alternately laminated. The build-up layer 500 includes five conductor layers and four resin insulating layers. The five conductor layers include a first conductor layer 10, a second conductor layer 30, a third conductor layer 130, a fourth conductor layer 230, and a fifth conductor layer 330. The first conductor layer 10, the second conductor layer 30, and the third conductor layer 130 are the same as those in the embodiment. The fourth conductor layer 230 and the fifth conductor layer 330 each have the same structure (a seed layer and an electrolytic plating layer) as the second conductor layer 30. The fourth conductor layer 230 and the fifth conductor layer 330 are formed using the same method as that for the second conductor layer 30.

The four resin insulating layers include a first resin insulating layer 20, a second resin insulating layer 120, a third resin insulating layer 220, and a fourth resin insulating layer 320. The first resin insulating layer 20 and second resin insulating layer 120 are the same as those of the embodiment. The third resin insulating layer 220 and the fourth resin insulating layer 320 have the same structure (resin and inorganic particles) as the first resin insulating layer 20. The first resin insulating layer 20, the second resin insulating layer 120, the third resin insulating layer 220, and the fourth resin insulating layer 320 are formed using the same method as that for the resin insulating layer 20 of the embodiment. The first resin insulating layer 20, the second resin insulating layer 120, the third resin insulating layer 220, and the fourth resin insulating layer 320 respectively have openings (26, 126, 226, 326).

The build-up layer 500 has four via conductors (40, 140, 240, 340). The via conductor 40 is formed in the opening 26 and connects the first conductor layer 10 and the second conductor layer 30. The via conductor 140 is formed in the opening 126 and connects the second conductor layer 30 and the third conductor layer 130. The via conductor 240 is formed in the opening 226 and connects the third conductor layer 130 and the fourth conductor layer 230. The via conductor 340 is formed in the opening 326 and connects the fourth conductor layer 230 and the fifth conductor layer 330. The openings (via conductor openings) (26, 126, 226, 326) that are respectively formed in the resin insulating layers (20, 120, 220, 320) are similar and have similar inner wall surfaces. The three via conductors (140, 240, 340) are stacked directly on the via conductor 40. The four via conductors (40, 140, 240, 340) form a stacked via.

The printed wiring board 502 of the modified example includes the five conductor layers (10, 30, 130, 230, 330) and the stacked via formed by the four via conductors (40, 140, 240, 340). When the printed wiring board 502 is used, a large stress is applied to a connecting portion between the lowermost via conductor 40 and the first conductor layer 10 such as the pad 14. However, in the modified example, connection reliability between the via conductor 40 and the first conductor layer 10 is high. Connection resistance via the via conductor 40 is unlikely to increase.

Alternative Example of Modified Example

The build-up layer 500 includes 5 or more conductor layers. The build-up layer 500 preferably has 10 or more conductor layers. The number of the conductor layers is 20 or less.

The cross-sectional views are each obtained by cutting the printed wiring board 2 along a plane perpendicular to the first surface 22. When a cross-sectional view includes a conductor circuit, a side surface of the conductor circuit is perpendicular to the cross-sectional view.

In the present specification, the term "flat surface" is used with respect to the shape of the inner wall surface 27, the shapes of the flat parts (93*a*), and the shapes of the third inorganic particles 93. The meaning of the "flat surface" used with respect to these is illustrated in FIGS. 1 and 3. That is, in FIGS. 1 and 3, the inner wall surface 27 is depicted substantially straight. The shape of the inner wall surface 27 in FIGS. 1 and 3 is substantially a straight line. The term "flat surface" in the present specification includes a substantially straight line in a cross section. As illustrated in the cross sections of the third inorganic particles 93 in FIGS. 1 and 3, in a cross section, cutting along a flat surface includes cutting along a straight line. The term "flat surface" in the present specification does not mean a perfect flat surface but includes a substantially flat surface. A substantially flat surface may include small unevenness.

Japanese Patent Application Laid-Open Publication No. 2015-126103 describes a printed wiring board having a first conductor layer, an insulating layer formed on the first conductor layer, and a second conductor layer formed on the insulating layer. The insulating layer has a via conductor through hole exposing the first conductor layer. A via conductor connecting the first conductor layer and the second conductor layer is formed in the through hole. The via conductor is formed of an electroless plating layer and an electrolytic plating layer. The insulating layer contains a resin and inorganic particles.

As illustrated in FIG. 17 of Japanese Patent Application Laid-Open Publication No. 2015-126103, in Japanese Patent Application Laid-Open Publication No. 2015-126103, an intermediate layer is provided on a wall surface (inner circumferential surface) of the through hole. The intermediate layer has a complex uneven surface due to gaps formed between the inorganic particles. The inorganic particles contained in the intermediate layer are the same as the inorganic particles contained in the insulating layer. As illustrated in FIG. 18 of Japanese Patent Application Laid-Open Publication No. 2015-126103, in Japanese Patent Application Laid-Open Publication No. 2015-126103, an electroless plating film is formed in the through hole. The electroless plating film follows the unevenness formed in the intermediate layer. Or, the gaps formed in the intermediate layer are filled with the electroless plating film. However, when the unevenness is complex, it is thought to be difficult to completely fill the gaps with the electroless plating film. When the electroless plating film is deposited, it is thought that a gas generated by a reaction inhibits the filling of the gaps. When the gaps are not completely filled with the electroless plating film, it is thought that voids are generated between the wall surface of the through hole and the electroless plating film. When the voids expand due to heat, it is thought that the electroless plating film peels off from the wall surface of the through hole.

A printed wiring board according to an embodiment of the present invention includes: a first conductor layer; a resin insulating layer that has a first surface and a second surface on an opposite side with respect to the first surface, an opening extending from the first surface to the second surface, and is laminated on the first conductor layer such that the second surface faces the first conductor layer; a second conductor layer that is formed on the first surface of the resin insulating layer; and a via conductor that is formed in the opening and connects the first conductor layer and the second conductor layer. The resin insulating layer contains a resin and inorganic particles. The inorganic particles include first inorganic particles forming the first surface and second inorganic particles embedded in the resin. The first inorganic particles each have a substantially flat exposed portion. The resin has an upper surface forming the first surface. The first surface is formed by the upper surface of the resin and the exposed portions of the first inorganic particles.

In a printed wiring board according to an embodiment of the present invention, substantially no recesses are formed on the first surface of the resin insulating layer. Therefore, when a seed layer is formed by sputtering on the resin insulating layer, the embodiment can form a continuous seed layer even when a sputtered film is thin. As a result, when the seed layer is removed, the embodiment can reduce an etching amount. The embodiment can form fine signal wirings.

Obviously, numerous modifications and variations of the present invention are possible in light of the above teachings. It is therefore to be understood that within the scope of the appended claims, the invention may be practiced otherwise than as specifically described herein.

The invention claimed is:

1. A printed wiring board, comprising:

a first conductor layer;

a resin insulating layer laminated on the first conductor layer;

a second conductor layer formed on a surface of the resin insulating layer; and a via conductor formed in the resin insulating layer such that the via conductor is connecting the first conductor layer and the second conductor layer, wherein the resin insulating layer includes resin and inorganic particles comprising first particles and second particles such that the first particles have flat exposed portions, the second particles are embedded in the resin, and the surface of the resin insulating layer includes the resin and the flat exposed portions of the first particles, and the resin insulating layer is formed such that each of the second particles has a spherical shape, the first particles are formed from the second particles, and a ratio of a volume of the first particles to a volume of spheres envisioned from the first particles is 0.8 or more.

2. The printed wiring board according to claim 1, wherein the resin insulating layer is formed such that the surface of the resin insulating layer is flat.

3. The printed wiring board according to claim 2, wherein the resin insulating layer is formed such that the surface of the resin insulating layer has an arithmetic mean roughness Ra of less than 0.08 μm.

4. The printed wiring board according to claim 2, wherein the resin insulating layer is formed such that steps are formed between the surface of the resin insulating layer and the flat exposed portions of the first particles.

5. The printed wiring board according to claim 2, wherein the via conductor is formed in an opening formed through the resin insulating layer, and the resin insulating layer is formed such that the inorganic particles include third particles having flat parts and that an inner wall surface in the opening includes the flat parts of the third particles and the resin.

6. The printed wiring board according to claim 5, wherein the resin insulating layer is formed such that the flat parts of the third particles and the resin of the inner wall surface form a common surface.

7. The printed wiring board according to claim 1, wherein the resin insulating layer is formed such that steps are formed between the surface of the resin insulating layer and the flat exposed portions of the first particles.

8. The printed wiring board according to claim 1, wherein the via conductor is formed in an opening formed through the resin insulating layer, and the resin insulating layer is formed such that the inorganic particles include third particles having flat parts and that an inner wall surface in the opening includes the flat parts of the third particles and the resin.

9. The printed wiring board according to claim 8, wherein the resin insulating layer is formed such that the flat parts of the third particles and the resin of the inner wall surface form a common surface.

10. The printed wiring board according to claim 8, wherein the resin insulating layer is formed such that each of the second particles has a spherical shape and that the third particles have shapes obtained by cutting the second particles with a plane.

11. The printed wiring board according to claim 8, wherein the inorganic particles include oxygen.

12. The printed wiring board according to claim 8, further comprising:

an adhesive layer formed on the second conductor layer.

13. The printed wiring board according to claim 1, wherein the second conductor layer includes a seed layer and an electrolytic plating layer on the seed layer such that the seed layer includes a first layer and a second layer formed on the first layer, the first layer is a film formed by sputtering and comprising an alloy comprising copper and aluminum, and the second layer is a film formed by sputtering and comprising copper.

14. The printed wiring board according to claim 13, wherein the second conductor layer is formed such that the alloy of the first layer in the seed layer includes silicon.

15. The printed wiring board according to claim 14, further comprising:

an adhesive layer formed on the second conductor layer.

16. The printed wiring board according to claim 13, further comprising:

an adhesive layer formed on the second conductor layer.

17. The printed wiring board according to claim 1, further comprising:

an adhesive layer formed on the second conductor layer.

18. A method of manufacturing a printed wiring board, comprising:

forming a resin insulating layer on a first conductor layer;

forming a second conductor layer on a surface of the resin insulating layer; and forming a via conductor in the resin insulating layer such that the via conductor connects the first conductor layer and the second conductor layer, wherein the resin insulating layer includes resin and inorganic particles comprising first particles and second particles such that the first particles have flat exposed portions, the second particles are embedded in the resin, and the surface of the resin insulating layer includes the resin and the flat exposed portions of the first particles, and the resin insulating layer is formed such that each of the second particles has a spherical shape, the first particles are formed from the second particles, and a ratio of a volume of the first particles to a volume of spheres envisioned from the first particles is 0.8 or more.

19. The method of claim 18, wherein the via conductor is formed in an opening formed through the resin insulating layer, and the resin insulating layer is formed such that the inorganic particles include third particles having flat parts and that an inner wall surface in the opening includes the flat parts of the third particles and the resin.

20. The method of claim 19, wherein the forming of the resin insulating layer incudes forming the inorganic particles having protruding portions such that the protruding portions protrude from the inner wall surface in the opening of the resin insulating layer, and removing the protruding portions of the inorganic particles such that the third inorganic particles are formed.

* * * * *